(12) United States Patent
Cho et al.

(10) Patent No.: US 7,480,196 B2
(45) Date of Patent: Jan. 20, 2009

(54) SEMICONDUCTOR DEVICE GENERATING A TEST VOLTAGE FOR A WAFER BURN-IN TEST AND METHOD THEREOF

(75) Inventors: Jin-Hyung Cho, Suwon-si (KR); Hi-Choon Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 188 days.

(21) Appl. No.: 11/651,973

(22) Filed: Jan. 11, 2007

(65) Prior Publication Data

US 2007/0165470 A1   Jul. 19, 2007

(30) Foreign Application Priority Data

Jan. 13, 2006   (KR) ...................... 10-2006-0003717

(51) Int. Cl.
  *G11C 7/00*   (2006.01)
(52) U.S. Cl. .................. 365/201; 365/200; 365/189.011
(58) Field of Classification Search .................. 365/201, 365/200, 189.011
  See application file for complete search history.

(56) References Cited

U.S. PATENT DOCUMENTS 7,106,644 B2 *  9/2006  Chou ......................... 365/201

FOREIGN PATENT DOCUMENTS

| JP | 2002-230997 | 8/2002 |
|---|---|---|
| JP | 2002-245797 | 8/2002 |
| KR | 1999-0086097 | 12/1999 |
| KR | 0346829 | 7/2002 |

* cited by examiner

*Primary Examiner*—Anh Phung
*Assistant Examiner*—Nam Nguyen
(74) *Attorney, Agent, or Firm*—Harness, Dickey & Pierce, P.L.C.

(57) ABSTRACT

A semiconductor device for generating a test voltage for a wafer burn-in test and method thereof is disclosed. To generate the test voltage for a wafer burn-in test, a control signal may be generated in response to a supply voltage from an external wafer burn-in test device. A supplementary voltage may be generated in response to the control signal by using an internal voltage driving circuit. The test voltage may be generated by combining the supply voltage and the supplementary voltage.

19 Claims, 6 Drawing Sheets

SEMICONDUCTOR DEVICE GENERATING A TEST VOLTAGE FOR A WAFER BURN-IN TEST AND METHOD THEREOF

PRIORITY STATEMENT

This application claims priority under 35 U.S.C. § 119 to Korean Patent Application No. 2006-3717, filed on Jan. 13, 2006, in the Korean Intellectual Property Office (KIPO), the entire contents of which are herein incorporated by reference.

BACKGROUND

1. Field

Example embodiments relate to a wafer burn-in test, for example, a method and a semiconductor device for generating a test voltage for a wafer burn-in test.

2. Description of the Related Art

In general, a screening test may be performed at an early stage to identify if a semiconductor memory device, for example, dynamic random-access memory (DRAM), has any defects; the screening test may include a wafer burn-in test. The wafer burn-in test may identify potential defects in the semiconductor memory device by exposing the semiconductor memory device to worst-case scenario conditions, for example, a high temperature and a high voltage, for a short time period. The wafer burn-in test may be performed to detect the defects in the semiconductor memory device at an early stage, before a semiconductor wafer is divided into a plurality of memory chips.

During the wafer burn-in test, an appropriate voltage may be applied to the wafer to detect the defects in the semiconductor memory device.

Generally, a driving voltage for the wafer burn-in test may be supplied from a wafer burn-in test device, where the driving voltage may include a DRAM logic control driving voltage (VDD), a word-line voltage (VPP), and a bit-line voltage (VBL).

FIG. 1 is a block diagram illustrating a conventional procedure that may provide a bit-line voltage (VBL) to a memory cell array when a wafer burn-in test is not being performed.

A bit-line voltage driving circuit 110 may be a circuit applying the bit-line voltage to the memory cell array when the wafer burn-in test is not being performed. For example, the bit-line voltage driving circuit 110 may provide the bit-line voltage to the memory cell when the wafer burn-in test is not being performed. The operation of the bit-line voltage driving circuit 110 is described later.

A bit-line voltage pad 120 may be a voltage pad to which the bit-line voltage may be applied from the wafer burn-in test device when the wafer burn-in test is being performed, and may be floated when the wafer burn-in test is not being performed. For example, when the bit-line voltage is high, a value of "1" may be written into the memory cell, and when the bit-line voltage is low, a value of "0" may be written into the memory cell.

Thus, when the wafer burn-in test is not being performed, the bit-line voltage pad 120 may not generate the bit-line voltage, but the bit-line voltage driving circuit 110 may generate the bit-line voltage.

FIG. 2 is a conventional circuit diagram illustrating the bit-line voltage driving circuit in FIG. 1.

Referring to FIG. 2, the bit-line voltage driving circuit 110 may include a reference voltage generator 210, a first comparator 220, a second comparator 230, a pull-up transistor 240 and a pull-down transistor 250.

The reference voltage generator 210 may receive a voltage from a power supply voltage VDD to generate first and second reference voltages. For example, the first reference voltage may be lower than the bit-line voltage and the second reference voltage may be higher than the bit-line voltage.

The first comparator 220 may compare a voltage VBL of the bit-line voltage driving circuit 110 with the first reference voltage to output a first comparison signal. For example, the first comparison signal may correspond to a logic "high" when the voltage VBL of the bit-line voltage driving circuit 110 is higher than the first reference voltage, and the first comparison signal may correspond to a logic "low" when the voltage VBL of the bit-line voltage driving circuit 110 is lower than the first reference voltage.

The second comparator 230 may compare the voltage VBL of the bit-line voltage driving circuit 110 with the second reference voltage to output a second comparison signal. For example, the second comparison signal may correspond to a logic "high" when the voltage VBL of the bit-line voltage driving circuit 110 is higher than the second reference voltage, and the second comparison signal may correspond to a logic "low" when the voltage VBL of the bit-line voltage driving circuit 110 is lower than the second reference voltage.

The pull-up transistor 240 may pull up the voltage VBL of the bit-line voltage driving circuit 110 based on the first comparison signal. For example, the pull-up transistor 240 may be implemented with a p-type metal-oxide semiconductor (PMOS), where the pull-up transistor 240 may pull up the voltage VBL of the bit-line voltage driving circuit 110 when the first comparison signal that may be applied to a gate of the PMOS is a logic "low."

The pull-down transistor 250 may pull down the voltage VBL of the bit-line voltage driving circuit 110 based on the second comparison signal. For example, the pull-down transistor 250 may be implemented with an n-type MOS (NMOS), where the pull-down transistor 250 may pull down the voltage VBL of the bit-line voltage driving circuit 110 when the second comparison signal that may be applied to a gate of the NMOS is a logic "high."

When the output voltage VBL of the bit-line voltage driving circuit 110 is lower than the first reference voltage, the first comparator 220 may generate the first comparison signal of a logic "low" and the pull-up transistor 240 may pull up the voltage VBL of the bit-line voltage driving circuit 110.

When the output voltage VBL of the bit-line voltage driving circuit 110 is higher than the second reference voltage, the second comparator 230 may generate the second comparison signal of a logic "high" and the pull-down transistor 250 may pull down the voltage VBL of the bit-line voltage driving circuit 110.

When the output voltage VBL of the bit-line voltage driving circuit 110 is higher than the first reference voltage and lower than the second reference voltage, the first comparator 220 may generate the first comparison signal of a logic "high" and the second comparator 230 may generate the second comparison signal of a logic "low."

Therefore, the output voltage VBL of the bit-line voltage driving circuit 110 may correspond to about VDD/2 and may be maintained between the first reference voltage and the second reference voltage.

FIG. 3 is a block diagram illustrating a conventional procedure for providing a bit-line voltage (VBL) to a memory cell array, when the wafer burn-in test is being performed.

The bit-line voltage driving circuit 110 may not operate when the wafer burn-in test is being performed. The reason is that the wafer burn-in test device may provide, to the memory cell array, a voltage that may be higher than that of the bit-line voltage driving circuit 110 when the wafer burn-in test is not being performed.

A bit-line voltage pad 120 may be a voltage pad to which the bit-line voltage is applied from the wafer burn-in test device when the wafer burn-in test is being performed, and may be floated when the wafer burn-in test is not being performed. For example, when the bit-line voltage is high, a value of "1" may be written into the memory cell, and when the bit-line voltage is low, a value of "0" may be written into the memory cell.

The wafer burn-in test device may provide the bit-line voltage pad 120 with a higher voltage when the wafer burn-in test is being performed than when the wafer burn-in test is not being performed. A higher current may thus be applied to the memory cell array when the wafer burn-in test is being performed than when the wafer burn-in test is not being performed.

Accordingly, as the capacity of a semiconductor memory device is increased, the bit-line voltage for the wafer burn-in test may also be increased, and thus the bit-line voltage that may be provided from the wafer burn-in test device may be reduced. For example, a sufficient voltage that may be used in the wafer burn-in test may not be provided from the wafer burn-in test device, because of a limitation in the wafer burn-in test device.

SUMMARY

In example embodiments, a method of generating a test voltage for a wafer burn-in test may include generating a control signal in response to a supply voltage from an external wafer burn-in test device, generating a supplementary voltage in response to the control signal by using an internal voltage driving circuit, and/or generating the test voltage by adding (or more, generally, combining) the supply voltage and the supplementary voltage.

The test voltage may be applied to bit lines of the semiconductor device. The semiconductor device may correspond to a dynamic random access memory device and/or the internal voltage driving circuit may correspond to a bit-line voltage driving circuit.

An additional current for performing the wafer burn-in test of a semiconductor device may be provided by the supplementary voltage of the internal voltage driving circuit.

According to example embodiments, a semiconductor device for generating a test voltage for a wafer burn-in test may include a pad configured to receive a supply voltage from an external wafer burn-in test device, a control signal generator configured to generate a control signal in response to the supply voltage, an internal voltage driving circuit configured to generate a supplementary voltage based on the control signal, and/or an adder configured to generate the test voltage by adding the supplementary voltage to the supply voltage.

The pad may be floated when the wafer burn-in test is not being performed and may receive the supply voltage from the external wafer burn-in test device when the wafer burn-in test is being performed. The semiconductor device may be a dynamic random access memory device.

The internal voltage driving circuit may include: a reference voltage generator configured to generate first and second reference voltages; a first comparator unit configured to disable an output when the wafer burn-in test is being performed, and configured to output a first comparison signal when the wafer burn-in test is not being performed; a second comparator unit configured to disable an output when the wafer burn-in test is being performed, and configured to output a second comparison signal when the wafer burn-in test is not being performed; a pull-up transistor configured to output the supplementary voltage in response to the control signal when the wafer burn-in test is being performed, and configured to output the bit-line voltage in response to the first comparison signal when the wafer burn-in test is not being performed, the pull-up transistor being coupled to an output terminal of the first comparator; and/or a pull-down transistor configured to be turned off in response to the control signal when the wafer burn-in test being performed, and configured to pull down the internal voltage in response to the second comparison signal when the wafer burn-in test is not being performed, the pull-down transistor being coupled to an output terminal of the second comparator.

The internal voltage may be a bit-line voltage and the internal voltage driving circuit may be a bit-line voltage driving circuit for generating a bit-line voltage.

The control signal generator may include: a first inverter configured to invert the supply voltage when the wafer burn-in test is being performed, an input terminal of the first inverter being coupled to the pad and an output terminal of the first inverter being coupled to a gate of the pull-up transistor; and/or a second inverter configured to invert the supply voltage when the wafer burn-in test is being performed, an input terminal of the second inverter being coupled to the pad and an output terminal of the second inverter being coupled to a gate of the pull-down transistor.

The adder may be a wired OR gate coupled to the pad and an output node of the internal voltage driving circuit.

A test voltage may be generated by adding a voltage outputted from the wafer burn-in test device to a voltage outputted from the bit-line voltage driving circuit, thereby providing sufficient current for the wafer burn-in test.

BRIEF DESCRIPTION OF THE DRAWINGS

The above and other features and advantages of example embodiments will become more apparent by describing in detail example embodiments thereof with reference to the attached drawings. The accompanying drawings are intended to depict example embodiments and should not be interpreted to limit the intended scope. The accompanying drawings are not to be considered as drawn to scale unless explicitly noted.

DESCRIPTION OF EXAMPLE EMBODIMENTS

Figure 1:
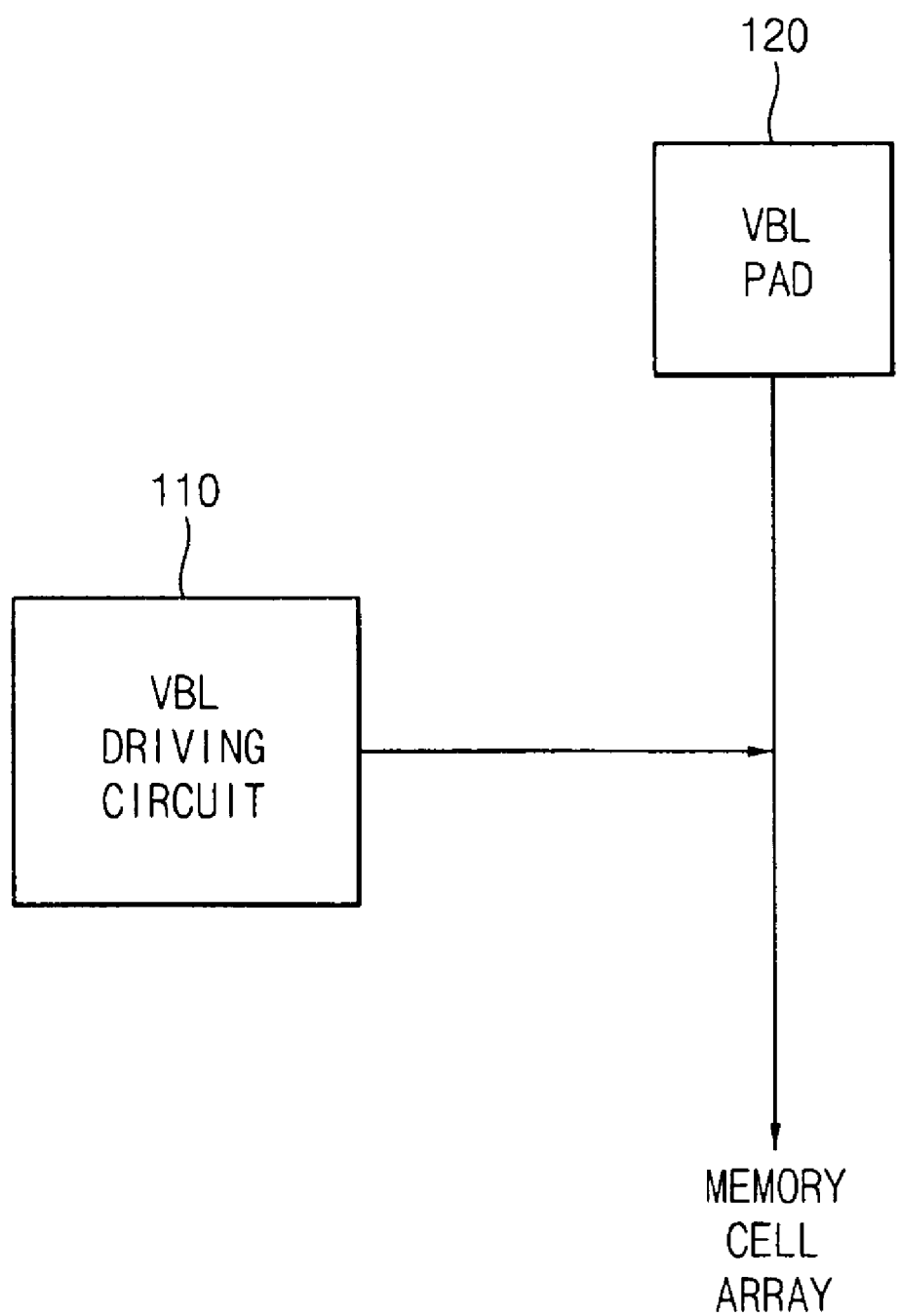
FIG. 1 is a block diagram illustrating a procedure of providing a bit-line voltage (VBL) to a memory cell array, for example DRAM, when a wafer burn-in test is not being performed.
Figure 2:
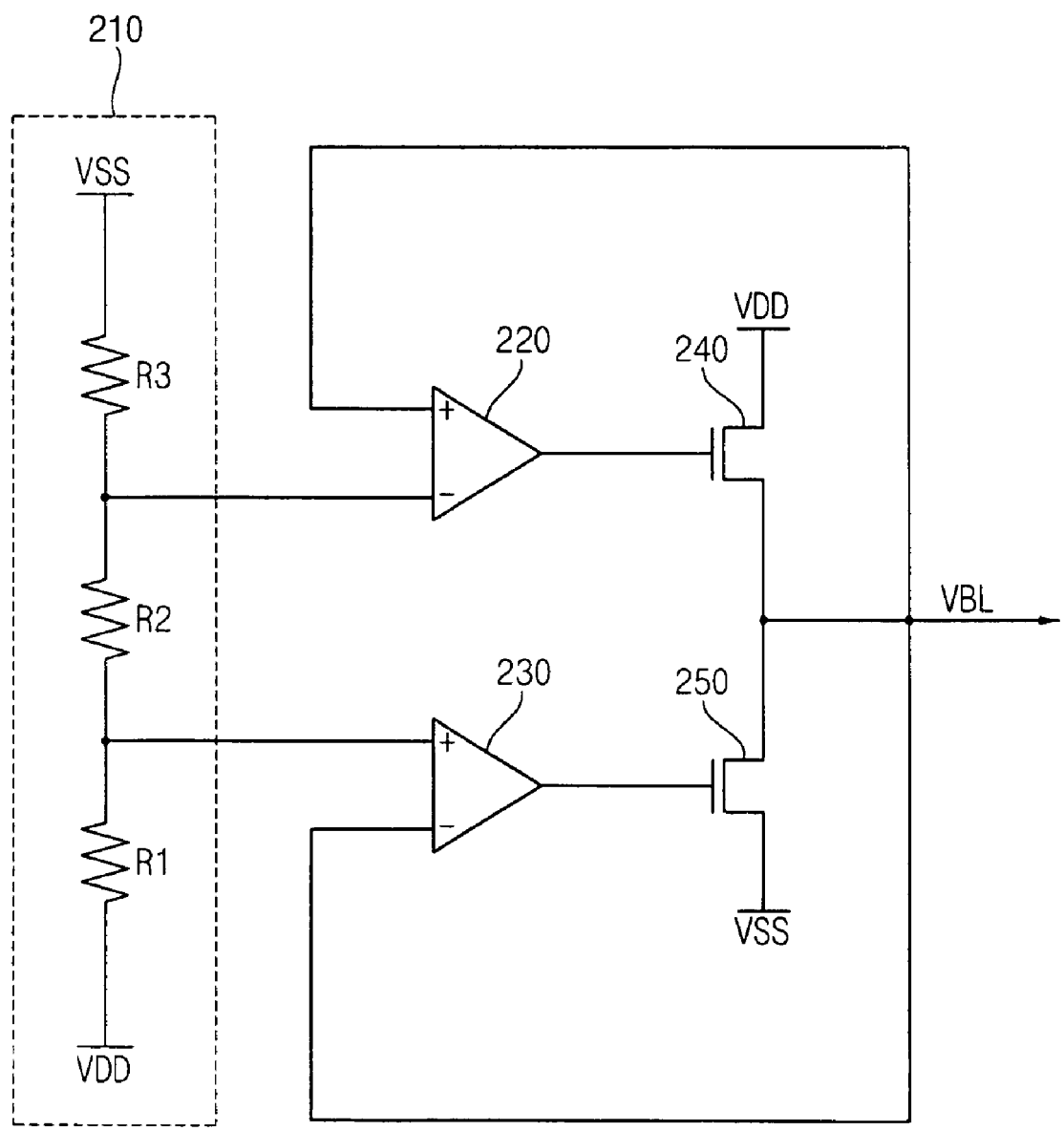
FIG. 2 is a circuit diagram illustrating the bit-line voltage driving circuit in FIG. 1.
Figure 3:
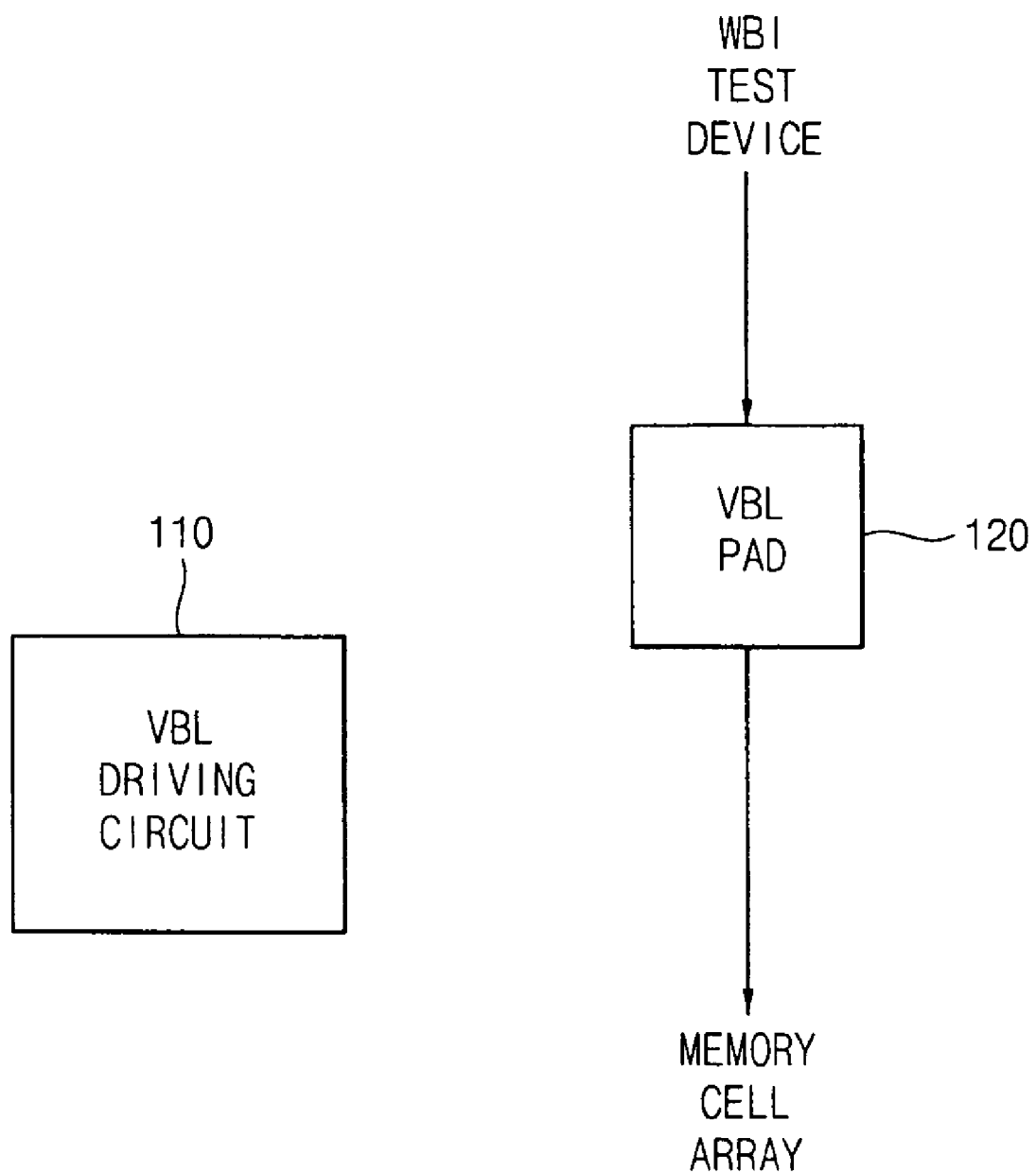
FIG. 3 is a block diagram illustrating a procedure of providing a bit-line voltage (VBL) to a memory cell array, for example DRAM, when the wafer burn-in test is being performed.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 4:
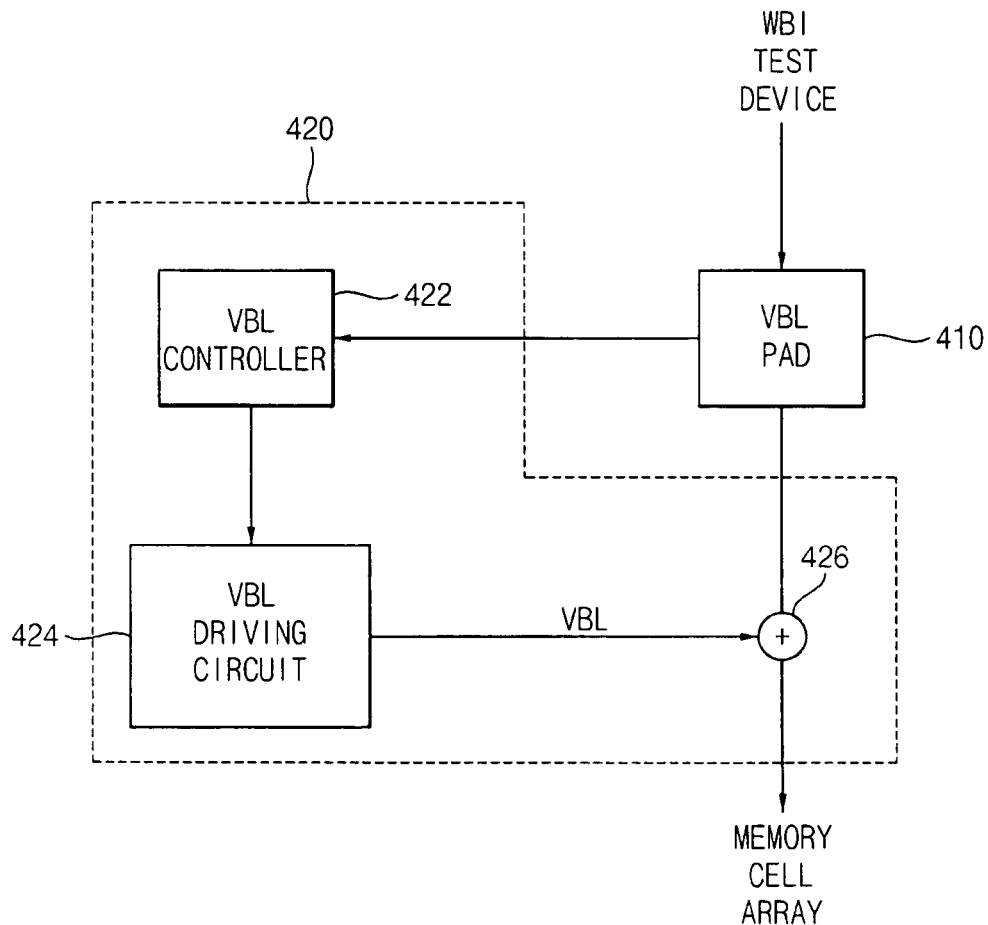
FIG. 4 is block diagram illustrating a wafer burn-in test circuit according to example embodiments.

FIG. 4 is block diagram illustrating a wafer burn-in test circuit according to example embodiments.

Referring to FIG. 4, the wafer burn-in test circuit 400 may include a bit-line voltage pad 410 and/or a wafer burn-in test voltage provider 420.

A bit-line voltage pad 410 may be a voltage pad to which a bit-line voltage is applied from a wafer burn-in test device when a wafer burn-in test is being performed. The bit-line voltage pad 410 may receive a first wafer burn-in test voltage from the wafer burn-in test device when the wafer burn-in test is being performed.

The wafer burn-in test voltage provider 420 may include a bit-line voltage controller 422, a bit-line voltage driving circuit 424 and/or a burn-in test voltage adder 426. The wafer burn-in test voltage provider 420 may receive a first wafer burn-in voltage outputted from the bit-line voltage pad 410 and may add a supplementary wafer burn-in voltage of the bit-line voltage driving circuit 424 to the first wafer burn-in voltage outputted from the bit-line voltage pad 410 to provide a second wafer burn-in test voltage to the memory cell array.

The bit-line voltage controller 422 may receive, through the bit-line voltage pad 410, the first wafer burn-in voltage outputted from the bit-line voltage pad 410 in order to generate at least one control signal for controlling the bit-line voltage driving circuit 424.

The bit-line voltage driving circuit 424 may receive the control signal outputted from the bit-line voltage controller 422 in order to generate the supplementary wafer burn-in voltage. For example, the bit-line voltage driving circuit 424 may pull up the supplementary wafer burn-in voltage when the control signal corresponds to a logic "high," and the bit-line voltage driving circuit 424 may pull down the supplementary wafer burn-in voltage when the control signal corresponds to a logic "low."

Example operation of the bit-line voltage driving circuit 424 will be described later.

Figure 5:
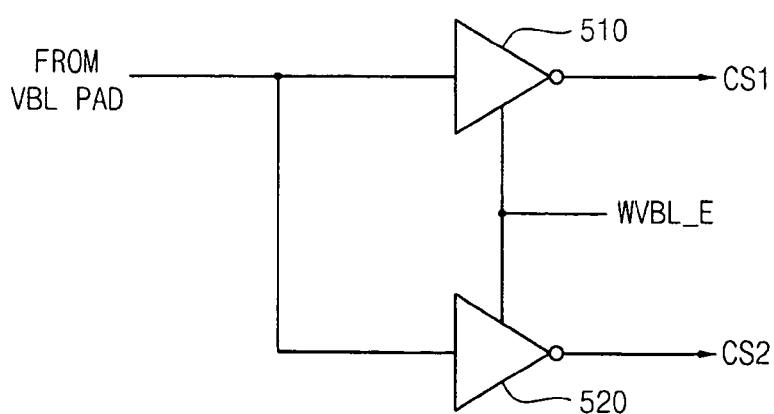
FIG. 5 is an example circuit diagram illustrating the bit-line voltage controller in FIG. 4.

FIG. 5 is an example circuit diagram illustrating the bit-line voltage controller in FIG. 4.

Referring to FIG. 5, the bit-line voltage controller 422 may include a first inverter 510 and/or a second inverter 520.

The first inverter 510 may operate when a wafer burn-in enable signal WVBL_E corresponds to a logic "high," and the first inverter 510 may receive the first wafer burn-in voltage from the bit-line voltage pad 410 in order to generate a first bit-line voltage control signal CS1.

The second inverter 520 may operate when the wafer burn-in enable signal WVBL_E corresponds to a logic "high," and the second inverter 520 may receive the first wafer burn-in voltage from the bit-line voltage pad 410 in order to generate a second bit-line voltage control signal CS2.

The first and second bit-line voltage control signals CS1 and CS2 may be signals for controlling the supplementary wafer burn-in voltage outputted from the bit-line voltage driving circuit 424.

When the wafer burn-in enable signal WVBL_E corresponds to a logic "low," the first and second inverters 510 and 520 may not operate. Therefore, the first and second bit-line voltage control signals CS1 and CS2, respectively outputted from the first and second inverters 510 and 520, may correspond to a logic "low."

When the wafer burn-in enable signal WVBL_E corresponds to a logic "high," the first and second inverters 510 and 520 respectively may receive the first wafer burn-in voltage in order to generate the first and second bit-line voltage control signals CS1 and CS2.

The bit-line voltage controller 422 in FIG. 5 may include the two inverters 510 and 520. However, the bit-line voltage controller 422 may alternatively include a single inverter that operates when the wafer burn-in enable signal WVBL_E corresponds to a logic "high," and the single inverter may generate the first and second bit-line control signals CS1 and CS2.

Figure 6:
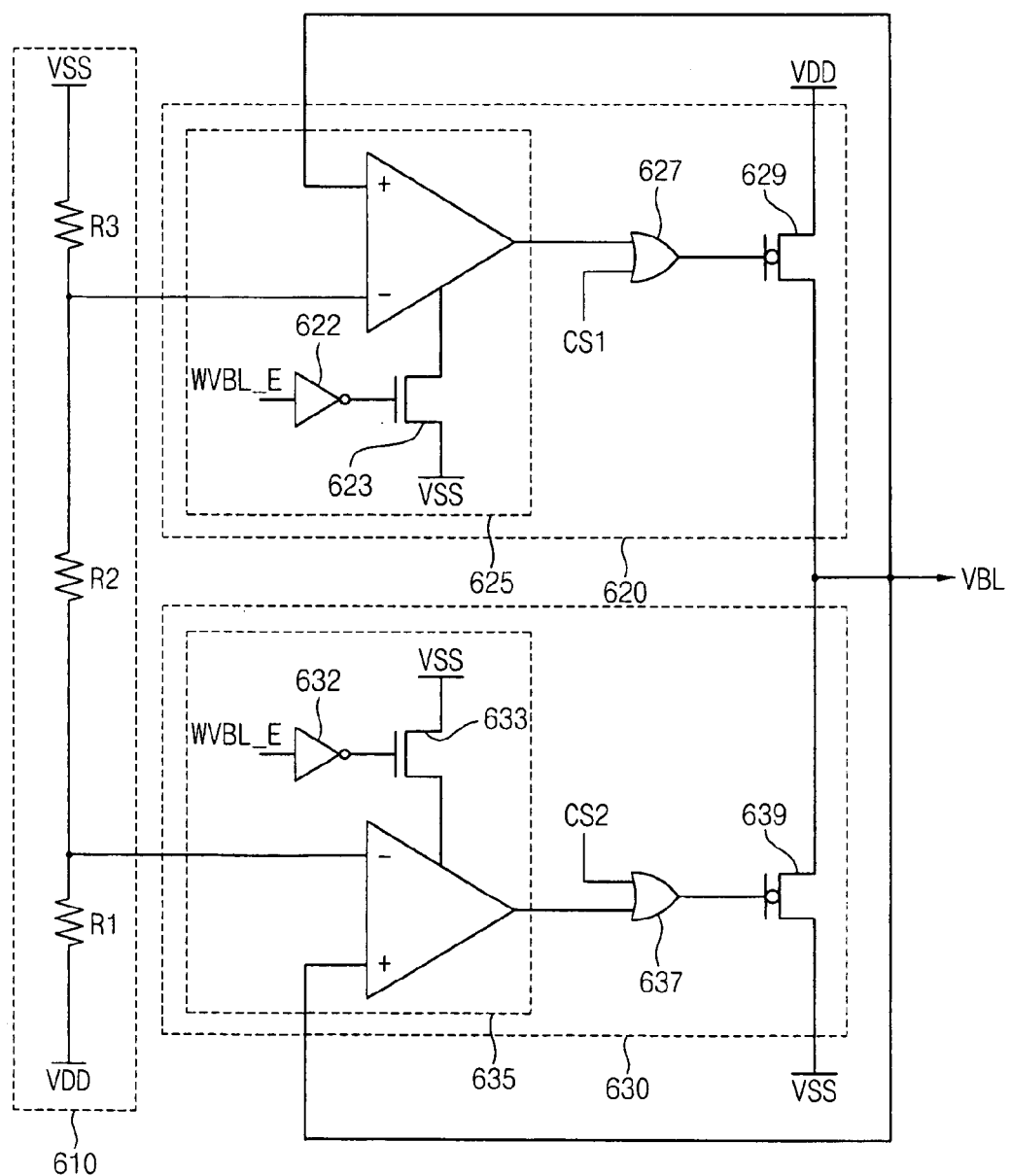
FIG. 6 is an example circuit diagram illustrating the bit-line voltage driving circuit in FIG. 4.

FIG. 6 is an example circuit diagram illustrating the bit-line voltage driving circuit in FIG. 4.

Referring to FIG. 6, the bit-line voltage driving circuit 424 may include a reference voltage generator 610, a first driving circuit 620 and/or a second driving circuit 630.

The reference voltage generator 610 may receive a voltage VDD from a power supply voltage in order to generate first and second reference voltages. For example, the first reference voltage may be lower than a voltage of the bit-line voltage driving circuit 424 and the second reference voltage may be higher than a voltage of the bit-line voltage driving circuit 424.

The first driving circuit 620 may include a first comparator unit 625, a first OR operation circuit 627 and/or a pull-up transistor 629.

The first comparator unit 625 may operate based on the wafer burn-in enable signal WVBL_E and the first comparator unit 625 may compare the first reference voltage with the voltage of the bit-line voltage driving circuit 424 in order to generate a first comparison signal.

For example, the first comparator unit 625 may operate when the wafer burn-in enable signal WVBL_E corresponds to a logic "low." Additionally, the first comparison result may correspond to a logic "high" when the voltage of the bit-line voltage driving circuit 424 is higher than the first reference voltage, and the first comparison signal may correspond to a logic "low" when the voltage of the bit-line voltage driving circuit 424 is lower than the first reference voltage. The operation of the first comparator unit 625 will be described later.

The first OR operation circuit 627 may receive the first comparison signal and the first bit-line voltage control signal CS1 in order to perform an OR operation. The first OR operation circuit 627 may generate a logic "high" when the first bit-line voltage control signal CS1 or the first comparison signal corresponds to a logic "high." The first OR operation circuit 627 may be implemented with an OR gate or implemented with a wired OR gate such that two lines of the first bit-line voltage control signal CS1 and the first comparison signal are hardwired.

The pull-up transistor 629 may pull up the voltage of the bit-line voltage driving circuit VBL based on a result of the first OR operation circuit 627. For example, the pull-up transistor 629 may be a p-type metal-oxide semiconductor (PMOS), and the pull-up transistor 629 may pull up the voltage of the bit-line voltage driving circuit VBL when the result of the first OR operation circuit 627 corresponds to a logic "low."

The second driving circuit 630 may include a second comparator unit 635, a second OR operation circuit 637, and/or a pull-down transistor 639.

The second comparator unit 635 operates based on the wafer burn-in enable signal WVBL_E, and the second comparator unit 635 compares the second reference voltage with the voltage of the bit-line voltage driving circuit 424 to generate a second comparison signal.

For example, the second comparator unit 635 may operate when the wafer burn-in enable signal WVBL_E corresponds to a logic "low." Additionally, the second comparison result corresponds to a logic "high" when the voltage of the bit-line voltage driving circuit 424 is higher than the second reference voltage, and the second comparison result corresponds to a logic "low" when the voltage of the bit-line voltage driving circuit 424 is lower than the second reference voltage. The operation of the second comparator unit 635 will be described later.

The second OR operation circuit 637 receives the second comparison signal and the second bit-line voltage control signal CS2 to perform an OR operation. That is, the second OR operation circuit 637 generates a logic "high" when one of the second bit-line voltage control signal CS2 and the second comparison signal corresponds to a logic "high." The second OR operation circuit 637 may be implemented with an OR gate or implemented such that two lines such as the second bit-line voltage control signal CS2 and the second comparison signal are hardwired.

The pull-down transistor 639 may pull down the voltage of the bit-line voltage driving circuit VBL based on a result of the second OR operation circuit 637. For example, the pull-down transistor 639 may be an n-type MOS (NMOS), and the pull-down transistor 639 may pull down the voltage of the bit-line voltage driving circuit VBL when the result of the second OR operation circuit 637 corresponds to a logic "high."

Example operation of the bit-line voltage driving circuit 424 is described as follows.

The first and second comparator units 625 and 635 may not operate when the wafer burn-in enable signal WVBL_E corresponds to a logic "high." Thus, the first and second comparator units 625 and 635 may not operate when the wafer burn-in test is being performed. As a result, the first and second comparator units 625 and 635 may output a logic "low" when the wafer burn-in test is being performed, and output signals of the first and second OR operation circuits 627 and 637 may be determined by the first and second bit-line voltage control signals CS1 and CS2.

When the first bit-line voltage control signal CS1 corresponds to a logic "low," the first OR operation circuit 627 may output a logic "low," and when the first bit-line voltage control signal CS1 corresponds to a logic "high," the first OR operation circuit 627 may output a logic "high."

When the first OR operation circuit 627 outputs a logic "low," the pull-up transistor 629 may pull up the supplementary wafer burn-in voltage.

When the second bit-line voltage control signal CS2 corresponds to a logic "low," the second OR operation circuit 637 may output a logic "low," and when the second bit-line voltage control signal CS2 corresponds to a logic "high," the second OR operation circuit 637 may output a logic "high."

When the second OR operation circuit 637 outputs a logic "high," the pull-down transistor 639 may pull down the supplementary wafer burn-in voltage.

However, when the wafer burn-in enable signal WVBL_E corresponds to a logic "low," the supplementary wafer burn-in voltage may move between the first and second reference voltages. Thus, when the wafer burn-in test is not being performed, the supplementary wafer burn-in voltage may move between the first and second reference voltages.

Figure 7:
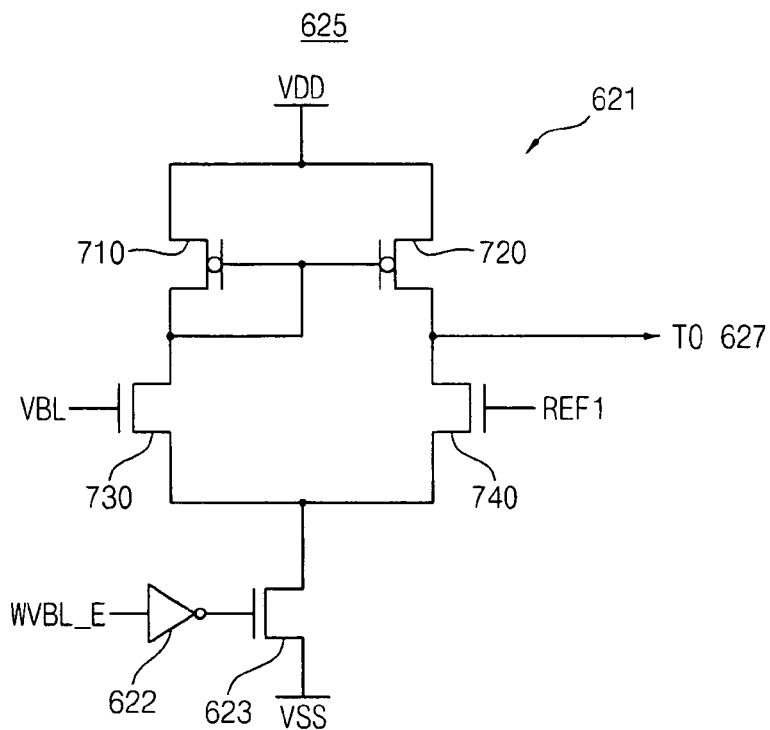
FIG. 7 is an example circuit diagram illustrating an example embodiment of the first comparator unit in FIG. 6.

FIG. 7 is an example circuit diagram illustrating an example of the first comparator unit in FIG. 6.

Referring to FIG. 7, the first comparator unit 625 may include a first comparator 621, a third inverter 622 and/or a first bias current generator 623.

The first comparator 621 may include a first PMOS 710, a second PMOS 720, a first NMOS 730 and/or a second NMOS 740.

In the first PMOS 710, a source of the first PMOS 710 may be coupled to a power supply voltage VDD, and a gate and a drain of the first PMOS 710 may be coupled to each other. In the second PMOS 720, a source of the second PMOS 720 may be coupled to the power supply voltage VDD, and a gate of the second PMOS 720 may be coupled to the gate of the first PMOS 710.

In the first NMOS 730, a drain of the first NMOS 730 may be coupled to the source of the first PMOS 710, and a gate of the first NMOS 730 may be coupled to the voltage of the bit-line voltage driving circuit VBL. In the second NMOS

740, a drain of the second NMOS 740 may be coupled to the drain of the second PMOS 720, and a gate of the second NMOS 740 may be coupled to a first terminal, outputting the first reference voltage REF1, of the reference voltage generator 610.

The first bias current generator 623 may be coupled to the first and second NMOS 730 and 740, and may generate a bias current based on the wafer burn-in enable signal WVBL_E. For example, the first bias current generator 623 may be implemented with an NMOS. The third inverter 622 may receive the wafer burn-in enable signal WVBL_E in order to generate an inverted wafer burn-in enable signal.

Example operation of the first comparator unit 625 is described as follows.

When the wafer burn-in enable signal WVBL_E corresponds to a logic "high," the third inverter 622 may output an inverted signal corresponding to a logic "low." Therefore, the first bias current generator 623 may be turned off and the first comparator 621 may not operate. Thus, the first comparator 621 may output a signal corresponding to a logic "low."

When the wafer burn-in enable signal WVBL_E corresponds to a logic "low," the third inverter 622 may output an inverted signal corresponding to a logic "high." Therefore, the first bias current generator 623 may generate the bias current, and the first comparator 621 may operate.

The first comparator unit 625 may compare the first reference voltage with the supplementary wafer burn-in voltage in order to output the first comparison signal to the first OR operation circuit 627. For example, the first comparison signal may correspond to a logic "high" when the supplementary wafer burn-in voltage is higher than the first reference voltage, and a logic "low" when the supplementary wafer burn-in voltage is lower than the first reference voltage.

Figure 8:
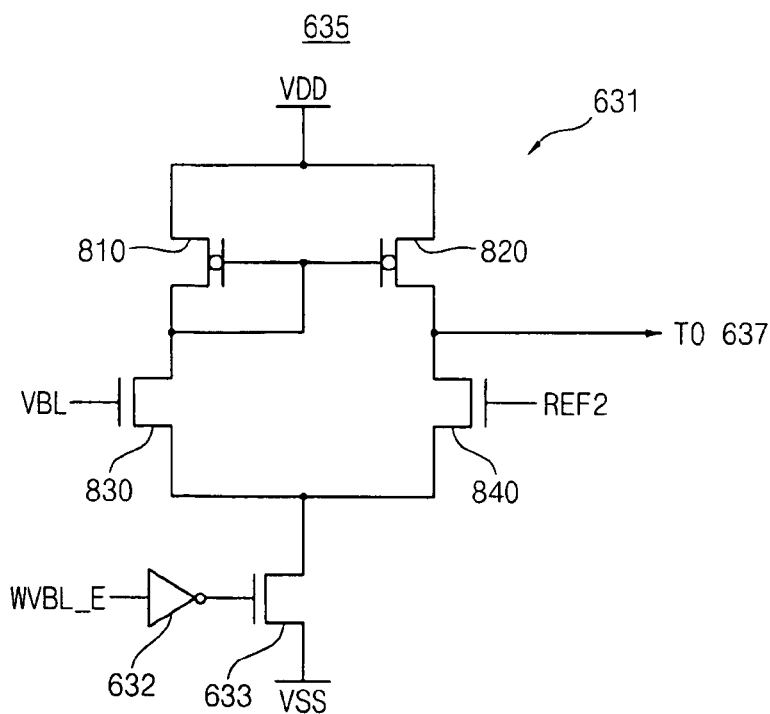
FIG. 8 is an example circuit diagram illustrating an example embodiment of the second comparator unit in FIG. 6.

FIG. 8 is an example circuit diagram illustrating an example of the second comparator unit in FIG. 6.

Referring to FIG. 8, the second comparator unit 635 may include a second comparator 631, a fourth inverter 632 and/or a second bias current generator 633.

The second comparator 631 may include a third PMOS 810, a fourth PMOS 820, a third NMOS 830 and a fourth NMOS 840.

In the third PMOS 810, a source of the third PMOS 810 may be coupled to a power supply voltage VDD, and a gate and a drain of the third PMOS 810 may be coupled to each other. In the fourth PMOS 820, a source of the fourth PMOS 820 may be coupled to the power supply voltage VDD, and a gate of the fourth PMOS 820 may be coupled to the gate of the third PMOS 810.

In the third NMOS 830, a drain of the third NMOS 830 may be coupled to the source of the third PMOS 810, and a gate of the third NMOS 830 may be coupled to the voltage of the bit-line voltage driving circuit VBL. In the fourth NMOS 840, a drain of the fourth NMOS 840 may be coupled to the drain of the fourth PMOS 820 and a gate of the fourth NMOS 840 may be coupled to a second terminal, outputting the second reference voltage REF2, of the reference voltage generator 610.

The second bias current generator 633 may be coupled to the third and fourth NMOS 830 and 840, and may generate a bias current based on the wafer burn-in enable signal WVBL_E. For example, the second bias current generator 633 may be implemented with an NMOS. The fourth inverter 632 may receive the wafer burn-in enable signal WVBL_E in order to generate an inverted wafer burn-in enable signal.

Example operation of the second comparator unit 635 is described as follows.

When the wafer burn-in enable signal WVBL_E corresponds to a logic "high," the fourth inverter 632 may output an inverted signal corresponding to a logic "low." Therefore, the second bias current generator 633 may be turned off and the second comparator 631 may not operate. Thus, the second comparator 631 may output a signal corresponding to a logic "low."

When the wafer burn-in enable signal WVBL_E corresponds to a logic "low," the fourth inverter 632 may output an inverted signal corresponding to a logic "high." Therefore, the second bias current generator 633 may generate the bias current, and thus the second comparator 631 may operate.

The second comparator unit 635 may compare the second reference voltage with the supplementary wafer burn-in voltage in order to output the second comparison signal to the second OR operation circuit 637. For example, the second comparison result may correspond to a logic "high" when the supplementary wafer burn-in voltage is higher than the second reference voltage, and a logic "low" when the supplementary wafer burn-in voltage is lower than the second reference voltage.

As described above, the semiconductor device according to example embodiments may generate a higher or lower voltage by adding or subtracting a voltage outputted from the wafer burn-in test device to a voltage outputted from the bit-line voltage driving circuit.

Example embodiments having thus been described, it will be obvious that the same may be varied in many ways. For example, the bit-line voltage driving circuit may be used as a circuit for providing a driving voltage of a control logic (VDD), a circuit for providing a driving voltage of a word-line (VPP), and so on.

Such variations are not to be regarded as a departure from the intended spirit and scope of example embodiments, and all such modifications as would be obvious to one skilled in the art are intended to be included within the scope of the following claims.

What is claimed is:

1. A method of generating a test voltage for a wafer burn-in test, comprising:
    generating a control signal in response to a supply voltage from an external wafer burn-in test device;
    generating a supplementary voltage in response to the control signal; and
    generating the test voltage by adding the supply voltage to the supplementary voltage.

2. The method of claim 1, wherein the supplementary voltage is generated by an internal voltage driving circuit.

3. The method of claim 2, wherein the internal voltage driving circuit is a bit-line voltage driving circuit.

4. The method of claim 1, further comprising:
    applying the test voltage to bit lines of a semiconductor device.

5. The method of claim 4, wherein the semiconductor device is a dynamic random access memory device.

6. The method of claim 2, wherein an additional current for performing the wafer burn-in test is provided by the supplementary voltage of the internal voltage driving circuit.

7. A semiconductor device for generating a test voltage for a wafer burn-in test, comprising:
    a pad configured to receive a supply voltage from an external wafer burn-in test device;
    a control signal generator configured to generate a control signal in response to the supply voltage;
    an internal voltage driving circuit configured to generate a supplementary voltage based on the control signal; and an adder configured to generate the test voltage by adding the supplementary voltage to the supply voltage.

8. The semiconductor device of claim 7, wherein the pad is floated when the wafer burn-in test is not being performed and receives the supply voltage from the external wafer burn-in test device when the wafer burn-in test is being performed.

9. The semiconductor device of claim 7, wherein the semiconductor device is a dynamic random access memory device.

10. The semiconductor device of claim 7, wherein the internal voltage driving circuit comprises:
　a reference voltage generator configured to generate first and second reference voltages;
　a first comparator unit for comparing the first reference voltage with the supplementary voltage;
　a second comparator unit for comparing the second reference voltage with the supplementary voltage;
　a pull-up transistor for pulling up the supplementary voltage; and
　a pull-down transistor for pulling down the supplementary voltage.

11. The semiconductor device of claim 10, wherein the first comparator unit is configured to disable an output when the wafer burn-in test is being performed, and configured to output a first comparison signal when the wafer burn-in test is not being performed.

12. The semiconductor device of claim 10, wherein the second comparator unit is configured to disable an output when the wafer burn-in test is being performed, and configured to output a second comparison signal when the wafer burn-in test is not being performed.

13. The semiconductor device of claim 11, wherein the pull-up transistor is configured to output the supplementary voltage in response to the control signal when the wafer burn-in test is being performed, and configured to output the internal voltage in response to the first comparison signal when the wafer burn-in test is not being performed, the pull-up transistor being coupled to an output terminal of the first comparator.

14. The semiconductor device of claim 12, wherein the pull-down transistor is configured to be turned off in response to the control signal when the wafer burn-in test performed, and configured to pull down the internal voltage in response to the second comparison signal when the wafer burn-in test is not being performed, the pull-down transistor being coupled to an output terminal of the second comparator.

15. The semiconductor device of claim 10, wherein the internal voltage is a bit-line voltage and the internal voltage driving circuit is a bit-line voltage driving circuit.

16. The semiconductor device of claim 7, wherein the control signal generator comprises:
　a first inverter and a second inverter configured to invert the supply voltage when the wafer burn-in test is being performed.

17. The semiconductor device of claim 16, wherein an input terminal of the first inverter is coupled to the pad and an output terminal of the first inverter is coupled to a gate of a pull-up transistor.

18. The semiconductor device of claim 16, wherein an input terminal of the second inverter is coupled to the pad and an output terminal of the second inverter is coupled to a gate of a pull-down transistor.

19. The semiconductor device of claim 7, wherein the adder includes a hardwired OR gate coupled to the pad and an output node of the internal voltage driving circuit.

\* \* \* \* \*